US012352785B2

(12) United States Patent
Austin

(10) Patent No.: US 12,352,785 B2
(45) Date of Patent: Jul. 8, 2025

(54) SAFE HARNESS WITH VOLTAGE AND CURRENT DETECTION

(71) Applicant: Vutility, Inc., Sandy, UT (US)

(72) Inventor: Micheal M. Austin, South Jordan, UT (US)

(73) Assignee: Vutility, Inc., Sandy, UT (US)

( * ) Notice: Subject to any disclaimer, the term of this patent is extended or adjusted under 35 U.S.C. 154(b) by 217 days.

(21) Appl. No.: 17/946,965

(22) Filed: Sep. 16, 2022

(65) Prior Publication Data

US 2023/0079938 A1    Mar. 16, 2023

Related U.S. Application Data

(60) Provisional application No. 63/245,130, filed on Sep. 16, 2021.

(51) Int. Cl.
*G01R 15/18* (2006.01)
*H02J 7/00* (2006.01)
*H02J 50/10* (2016.01)

(52) U.S. Cl.
CPC .......... *G01R 15/181* (2013.01); *H02J 7/0047* (2013.01); *H02J 50/10* (2016.02)

(58) Field of Classification Search
CPC .... G01R 15/181; G01R 15/142; G01R 21/06; H02J 50/10; H02J 7/0047
See application file for complete search history.

(56) References Cited

U.S. PATENT DOCUMENTS 3,657,650 A    4/1972 Arndt
4,413,871 A   11/1983 Swengel
(Continued)

FOREIGN PATENT DOCUMENTS

CN         210136263        3/2020
WO   WO-2009009878 A1 *   1/2009  ............... H04B 3/54
WO   WO-2012112924 A1 *   8/2012  ............ G01R 15/181

OTHER PUBLICATIONS

"BTAP Insulation Piercing Tap Connector", https://www.idealind.com/us/en/shop/market/btc500-4.html.
(Continued)

*Primary Examiner* — Christopher E Mahoney
(74) *Attorney, Agent, or Firm* — Foley & Lardner LLP

(57) ABSTRACT

Electrical current and/or voltage monitoring powered by induction and/or conductive spike, and related devices, apparatuses, systems, and methods are disclosed. An electricity monitoring device can include a measuring conductor electrically coupled to a monitored energy source to detect/read voltage of the monitored energy source. The electricity monitoring device can include an electrical component in which a fluctuating magnetic field is induced from a fluctuating flow of electrical current in the monitored energy source, the fluctuating magnetic field to produce an electromotive force to provide electrical energy. The electricity monitoring device can include a controller that can further include processing circuitry to be powered by the provided electrical energy, the controller coupled to the measuring conductor to determine a present run-time electrical voltage of the monitored energy source based on a reading of the measuring conductor. In some embodiments, the electrical component can be a Rogowski coil.

22 Claims, 7 Drawing Sheets

(56) References Cited

U.S. PATENT DOCUMENTS

| | | | |
|---|---|---|---|
| 4,709,339 A * | 11/1987 | Fernandes | H02J 13/00019 |
| | | | 374/E1.004 |
| 7,775,810 B2 | 8/2010 | Lawrence et al. | |
| 9,287,673 B2 | 3/2016 | Galla et al. | |
| 9,500,684 B1 * | 11/2016 | Pendergrass | H01R 4/2408 |
| 9,734,935 B2 | 8/2017 | Yoshida et al. | |
| 9,806,435 B2 | 10/2017 | Jones | |
| 9,945,892 B2 | 4/2018 | Ngo et al. | |
| 10,396,545 B2 | 8/2019 | Pieler et al. | |
| 10,768,205 B2 | 9/2020 | Russell | |
| 11,056,835 B2 | 7/2021 | Yuratich | |
| 2017/0025994 A1 | 1/2017 | Sader | |
| 2019/0329723 A1 | 10/2019 | Ogura | |
| 2020/0379022 A1 | 12/2020 | Patton | |

OTHER PUBLICATIONS

"VeriSafe™ Insulation Piercing Connector", https://www.panduit.com/content/dam/panduit/en/landing-pages/verisafe/D-SFSP03--SA-ENG-VeriSafeInsPierConn.pdf, 2018.

Consolidated Electronic Wire & Cable, "Consolidated Electronic Wire & Cable is proud to offer a wide selection of top-quality, custom cable and wire harnesses", https://www.conwire.com/products/cable-wiring-harnesses/, 2022.

testguy.net, "Test Equipment 101: The Basics of Electrical Testing", https://testguy.net/content/296-Test-Equipment-101-The-Basics-of-Electrical-Testing, Jun. 2019.

Warwick Test Supplies, "Guide to Insulation Piercing Connectors", https://www.warwickts.com/2199/Guide-to-Insulation-Piercing-Connectors, Dec. 13, 2018.

* cited by examiner

SAFE HARNESS WITH VOLTAGE AND CURRENT DETECTION

CROSS-REFERENCE TO RELATED APPLICATIONS

This application claims the benefit of U.S. Provisional Application No. 63/245,130, filed Sep. 16, 2021, titled "SAFE HARNESS WITH VOLTAGE DETECTION," which is hereby incorporated herein by reference in its entirety.

TECHNICAL FIELD

The present disclosure relates to monitoring electricity, and more particularly to induction powered electricity current and voltage monitoring.

BRIEF DESCRIPTION OF THE DRAWINGS

Additional aspects and advantages will be apparent from the following detailed description of preferred embodiments, which proceeds with reference to the accompanying drawings, in which.

DETAILED DESCRIPTION

Figure 1:
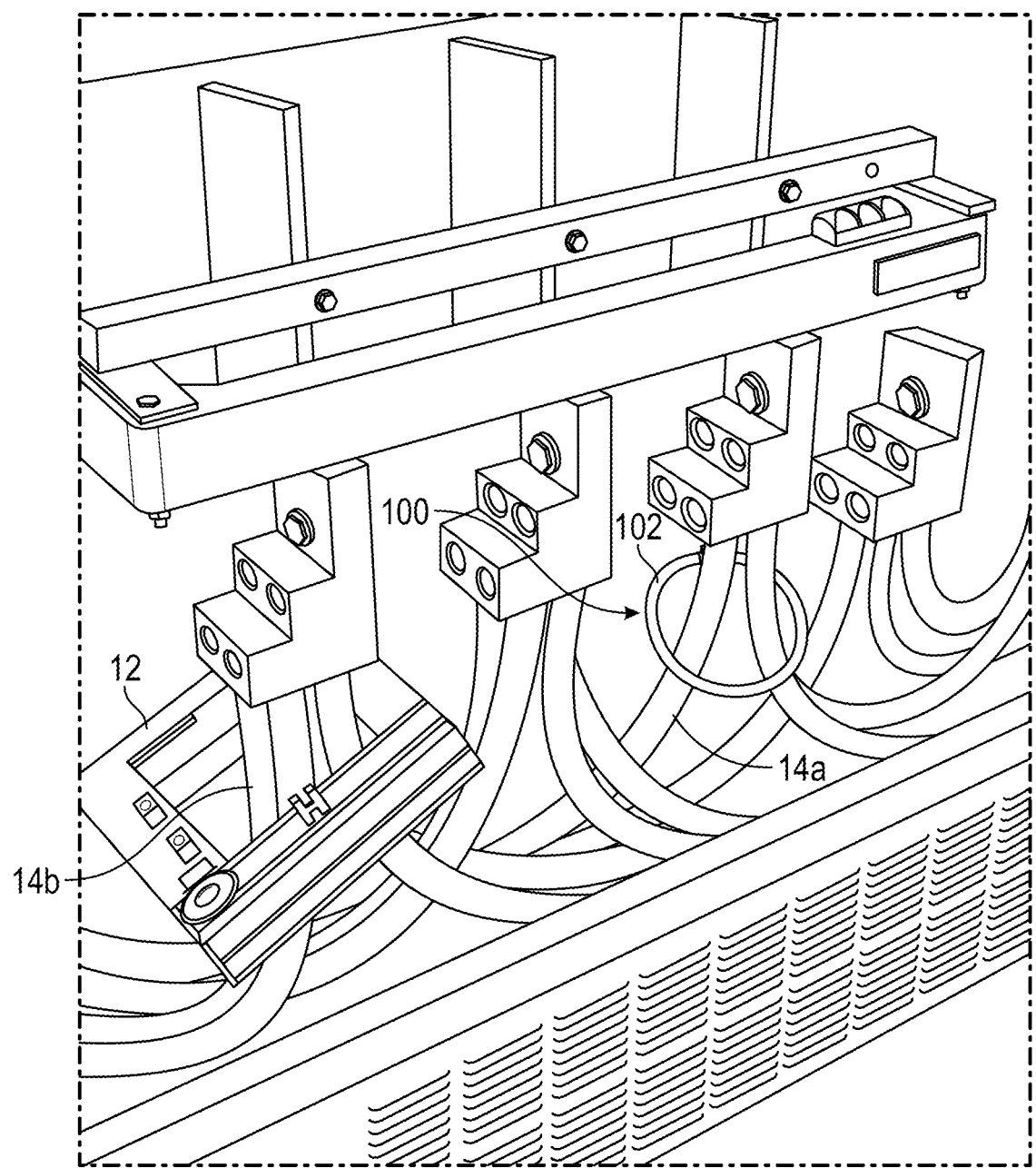
FIG. 1 is an electricity monitoring device, according to one embodiment of the present disclosure.

In general, monitoring electricity usage can facilitate better understanding of energy consumption to better manage critical assets, mitigate unnecessary energy or equipment loss and subsequent replacement or repair, and improve overall efficiencies (by saving financial expenditures and conserving valuable resources, such as labor). Monitoring electricity can also facilitate understanding and insights of energy consumption by different portions of a given electrical system (e.g., individual units of a multi-unit apartment complex). In the case of a three-phase electric system, phase-load-balancing and phase optimization may resolve typically uneven or lopsided panel wiring and certain issues related to efficiency of power factor (PF).

However, remote monitoring of electricity can be challenging as existing electricity monitoring devices typically require power to operate and/or to communicate measurements to a remote location. Moreover, existing electricity monitoring devices must be powered to provide monitoring or measuring. Additionally, monitoring of electricity usage can be challenging because existing electricity monitoring devices (e.g., electricity meters) are usually larger than the space inside an electrical panel and therefore require a wall-mounted enclosure 4X-rated by the National Electrical Manufacturer Association (NEMA), which is generally disposed separate from the distribution panel to accommodate the electricity monitoring device (e.g., a meter).

Installation of such existing electricity monitoring devices increases the complexity and costs of monitoring because the wiring from the panel that houses the energy source(s) to the meter requires a protection within rigid conduits (according to safety regulations), which in turn necessitates the apertures or openings to be formed in the electrical panels that makes such installation an intrusive operation. Therefore, existing electricity monitoring devices usually require: (i) a dedicated conduit for transmitting power from an energy-source/power-source to operate the meter; (ii) a separate and dedicated conduit extending from the distribution-panel to the meter to enclose all 10 to 13 hard-wired sensing lines (e.g., the lines that protrude outside of the panel and that could carry high-voltages, hence the reason why they need to be housed within a conduit); and (iii) a dedicated conduit for communicating the measurements to a remote location (e.g., via the Ethernet, Modbus protocol, or cellular router and extended antenna).

Stated differently, existing three-phase-voltage monitoring devices are mounted on a wall and have a plurality of conduits installed to transport power and measuring lines. A skilled electrician is needed for installation of such existing electricity monitoring devices and such installation requires that electrical power (that is transmitted to the monitored electrical system) be shut down during the installation of the meter. A total installation time for existing electricity monitoring devices is generally measured hours (or potentially days).

Further, persons of ordinary skill would not typically consider placing a wireless monitoring device inside the electrical panel firstly because dimensions of the existing monitoring devices are typically greater than the electrical panel can fit, and secondly because the electrical panel performs as a "Faraday cage" that blocks or substantially hinders available wireless technology signals, such as cellular, Wi-Fi, Bluetooth, Zigbee, and the like. Some technology advancements were recently developed that could enable a wireless generated signal from inside the electrical panel to penetrate the noise and interference of the electrical panel (performing as the Faraday cage), however, such advanced technologies are not yet typically present in the existing electricity monitoring devices.

The present disclosure provides for induction powered electricity monitoring, and related devices, apparatuses, and methods. Certain embodiments disclosed herein harvest power by induction from a monitored energy source (e.g., a wire or other conductor) to power a controller or other processing circuitry. In some embodiments, a portion of the harvested energy is potentially stored and/or released to power the controller. The controller may take a present (e.g., real-time or run-time) sample or measurement from which present electrical activity within the monitored energy source can be inferred or otherwise determined. The released energy can further power the controller to transmit and/or receive information. The controller may also utilize a portion of the harvested energy as the sample or the measurement.

By harvesting power through induction, disclosed embodiments can be more easily deployed in remote locations, or any location, without concern for access to a separate power source or connection.

The present disclosure provides for measuring one or more voltages and/or currents associated with, for example, the three-phase electricity in a high-voltage electrical distribution panel or individual energy sources (e.g., one or more wires). The present disclosure is directed to the related methods, devices, and apparatuses configured to detect and measure at least one of three voltages and/or currents mentioned above. More specifically, the present disclosure is directed to embodiments of a safely installable harness that is configured to measure voltages and/or currents substantially in a non-intrusive manner and self-power a monitoring device (e.g., power a controller).

The present disclosure will be better understood from the detailed description provided below and from the drawings of various embodiments, methods, and examples herein. These specifics, however, are provided for explanatory purposes that help the various embodiments of the disclosure to be better understood. The invention should therefore not be limited by the described embodiments, methods, and examples, but by all embodiments and methods within the scope and spirit of the invention as claimed.

In general, the electricity monitoring device is configured to monitor three-phase electricity power and/or energy in synchronized monitored conductors or sources of energy (e.g., wire, cable, and the like) that the electricity monitoring device at least partially surrounds. The current I and/or voltage V can be inferred based on fundamental power equations:

$$P = I * V \quad \text{(Equation 1)}$$

$$I = P/V \quad \text{(Equation 2)}$$

$$V = P/I \quad \text{(Equation 3)}$$

For example, the power is measured by multiplication of voltage values measured in volts and current values measured in amps. In some embodiments, the energy is measured by multiplication of volts, amp-hours, and a power factor (PF). Also, the power factor is defined by the true power used by the electrical system divided by the apparent power delivered to the electrical system. In some embodiments, the fluctuating flow of electrical current in the monitored energy source may be alternating current (AC) within a wire. In other embodiments, the fluctuating flow of electrical current in the monitored energy source may be direct current (DC), with a fluctuating flow (e.g., a fluctuating intensity or rate), within the monitored energy source.

FIG. 1 illustrates an electricity monitoring device 100, according to one embodiment of the present disclosure. Additionally, FIG. 1 illustrates a conventional current transformer (CT) 12 that typically has a square or rectangular shape. Irregular-shaped and/or large cable bundles are commonly installed in a building main (e.g., an electrical distribution panel at least partially housing one or more energy sources 14a, 14b (e.g., power sources). Typically, these large, irregular-shaped cables are of various shapes and types and are fed and securely coupled (electrically and/or physically) together in phases, as illustrated in FIG. 1. A first set of energy sources 14a are grouped together as a first phase and a second set of energy sources 14b are grouped together as a second phase. Such coupling into phases can makes installation of relatively rigid CT 12 more difficult because the installer of the CT 12 must encircle every energy source 14b for a given phase with the CT 12 to accurately read the current of the singular phase in applications having high power requirements. Further, access to a cable bundle can be difficult to obtain and when accessible, it may be impossible or substantially difficult to close protective doors of the panel when a CT 12 having such a relatively large window is installed.

The electricity monitoring device of FIG. 1 may include a flexible electrical component 102 to facilitate collectively encompassing all energy sources 14a to be monitored (a monitored energy source), such as all the energy sources 14a of a given phase. Utilizing a relatively flexible coil as an electrical component 102 of the electricity monitoring device 100, can offer advantages over and be more versatile than a typical CT 12 when monitoring building mains (e.g., monitoring the energy sources 14a, 14b in an electrical distribution panel). It is preferable to surround the entire bundle of the parallelly connected energy sources 14a or 14b to monitor a particular first or second phase, respectively. The typical CT 12 may not be able to fit around the energy sources 14b. Additionally, even if the typical CT 12 may fit around the cabling including one or more energy sources 14b, it may be challenging to locate a position on the cabling where the CT 12 can be positioned behind the panel door without electric and/or magnetic field disruption and/or without compromising measurement values. As an example, an electrical component 102 of the electricity monitoring device 100 may include a Rogowski coil to detect current in the monitored energy source 14a. The Rogowski coil or other flexible electrical component 102 provides a flexible shape that can be installed around an irregular-shaped and/or large cable bundle relatively more efficiently or easily than the rigid CT 12. The flexible shape of the Rogowski coil can also enable installation of the electricity monitoring device 100 within the distribution-panel and/or a breaker box relatively more efficiently than the CT 12. As described elsewhere herein, the Rogowski coil provides a resolution for accessing individual cables or energy sources 14a to be monitored in a bundled set.

Figure 2:
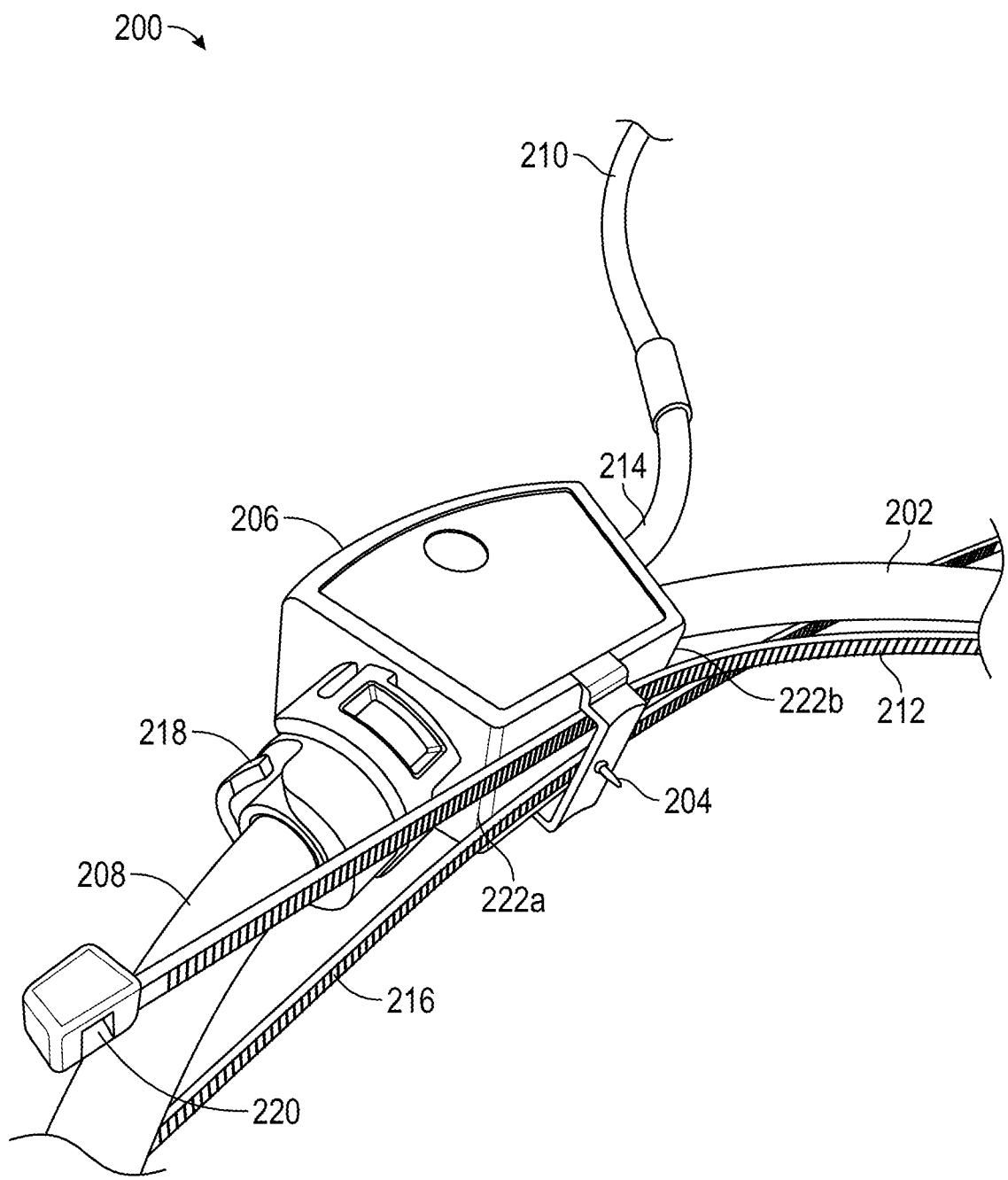
FIG. 2 is an electricity monitoring device, according to another embodiment of the present disclosure.

FIG. 2 provides a more detailed view of certain components of an electricity monitoring device 200, according to another embodiment of the present disclosure. The electricity monitoring device 200 may be identical to or similar in some respect to the electricity monitoring device 100 of FIG. 1. Accordingly, like features may be designated with like reference numerals, with the leading digits incremented to "2". Relevant disclosure set forth above regarding similarly identified features thus may not be repeated hereafter. Moreover, specific features of the electricity monitoring device 200 may not be shown or identified by a reference numeral in the drawings or specifically discussed in the written description that follows. However, such features may clearly be the same, or substantially the same, as features depicted in other embodiments and/or described with respect to such embodiments. Accordingly, the relevant descriptions of such features apply equally to the features of the electricity monitoring device 200. Any suitable combination of the features and variations of the same described with respect to the electricity monitoring device 100 can be employed with the electricity monitoring device 200, and vice versa. This pattern of disclosure applies equally to further embodiments depicted in subsequent figures and described hereafter.

In some embodiments, the electricity monitoring device 200 comprises a safely installable harness that includes a measuring conductor 204 (e.g., a conductive spike). Such measuring conductor 204 can resemble a vampire tooth, tap, or pin to tap and draw power from a monitored energy source to power the electricity monitoring device 200 while in in an operative state, e.g., while electrically coupled to a monitored energy source (e.g., at least one of three three-phase conductors or energy sources). The measuring conductor 204 is to enable monitoring electricity, and specifically voltage, and/or power-factor, and changes to these over time. In some, embodiments, for example, when used in concert with other current and/or voltage monitoring devices installed and co-located within the same electrical panel and on the same phase as being monitored by an embodiment of the present disclosure, one can obtain present (e.g., real-time, or run-time) true root mean square (true-RMS) values for energy (measured in Kilowatt-hours) and power (measured in Kilowatts) on every individual energy source inside the panel. Therefore, more parameters can be monitored at a more granular level besides monitoring the general combined energy source fed to the electrical main distribution panel. Additionally or optionally, tenant-submetering and/or a utility-grade metering can be achieved by the electricity monitoring device 200.

As illustrated in FIG. 2, the electricity monitoring device 200 includes an inductive energy transfer electrical component 202, having its ends connected to a housing 206 from which a measuring conductor 204 extends. The electricity monitoring device 200 also includes a controller (e.g., controller 500 in FIG. 5) that may include processing circuitry and/or analysis circuitry, and a coupling cable 210 to electrically and/or physically couple the housing 206 and the controller. The electricity monitoring device 200 is inductively powered and can monitor electricity current and/or voltage in a monitored energy source (e.g., electrical conductor, power sources 14a of FIG. 1). The monitored energy source may be a wire, such as the wire that is typically disposed in a three-phase power line fed to a building. In other embodiments, the monitored energy source may be a distribution line or a transmission line.

The inductive energy transfer electrical component 202 (or simply the electrical component 202) may be a current transformer. In another embodiment, the electrical component 202 may be an inductive frequency panel (e.g., compatible with Qi, an open interface standard developed by the Wireless Power Consortium for inductive charging over distances). In yet another embodiment, the electrical component 202 can be a Rogowski coil 208, as shown in FIG. 2. The inductive energy transfer electrical component 202 can produce a fluctuating magnetic field from a fluctuating flow of electrical current in the monitored energy source, which can be used for determining the electrical current in the monitored energy source and/or for powering logic and wireless transmission circuitry of the controller. Stated otherwise, the controller may be powered by energy harvested by the electrical component 202. The controller may include processing circuitry for taking a measurement of the monitored energy source (e.g., a measurement of current and/or voltage). The relatively small measuring conductor 204 can be coupled, for example, via molding to couple rigidly in a fixed position on an inside surface of the electrical component 202.

The fluctuating magnetic field may also induce an electromotive force, and therefore electrical energy, within a coupling cable 210. The coupling cable 210 may be a coil or a wire that is electrically coupled to or included in the controller. The coupling cable 210 is electrically coupled to the inductive energy transfer electrical component 202. The fluctuating magnetic field produced by the inductive energy transfer electrical component 202 induces the electromotive force to provide electric current and/or voltage for delivery of electrical energy to the controller. The coupling cable 210 can be a shielded cable that prevents or substantially reduces interference of the electrical and magnetic fields that are external to the current and/or energy (that indicates e.g., voltage parameters). Such external magnetic and electric fields may result from the energy source, and/or components of the monitored electrical system or the electricity device 200, for example, the electrical component 202. Therefore, using the same coupling cable 210, the values of the current and voltage that are substantially not affected by the external interference from the magnetic and electrical field, can be provided from the electrical component 202 to the controller 500.

The coupling cable 210 may include multiple data lines (or conductors) having a mesh wire shielding that is wrapped around the data lines to prevent or substantially reduce intruding magnetic flux fields generated by external proximate sources (such as the energy source and/or magnetic field sources, for example, the electrical component 202) that can distort the data stream transmitted via the data lines of the coupling cable 210. In some embodiments, shielding formed in a mesh shape can be coupled to a conductor disposed inside the coupling cable 210. Additionally or optionally, a layer, such as a foil formed of mylar (e.g., biaxially-oriented polyethylene terephthalate) wrapping the data lines (or conductors) within the coupling cable 210 can prevent or substantially reduce the interference of the electrical and magnetic fields from the external sources.

A first data line (conductor) that transmits the current induced by the electromotive force to power the controller 500 (FIG. 5) is disposed within the coupling cable 210 along with a second data line (conductor) that transmits the voltage (and a relatively small current) from the measuring conductor 204. Both of these data lines (conductors) are feeding or otherwise operating at a frequency such as 40 Hz, 60 Hz, 80 Hz, and the like, which may be defined by a manufacturer of semiconductor devices that the controller 500 includes. The second data line associated with the voltage is disposed proximate to the first data line associated with the other sense lines of the Rogowski coil 208, and such proximity in a typical electricity monitoring devices can distort the signal provided by the Rogowski coil 208 where such distortion may occur internally within the coupling cable 210. Thus, the shielding of the coupling cable 210 facilitates elimination or substantial reduction of the external interferences as well as provides substantial shielding of the outside and inside distortions originated by the electric and magnetic flux fields from the first and second conductors disposed within the coupling cable 210. As said above, the first and second conductors can be disposed within the same coupling cable 210, therefore typically they need to be channeled as independent feeds and this necessity typically prevents other meter installation positioning these first and second conductors in the same conduit together and typically necessitates separate more expensive conduit installs.

Figure 3:
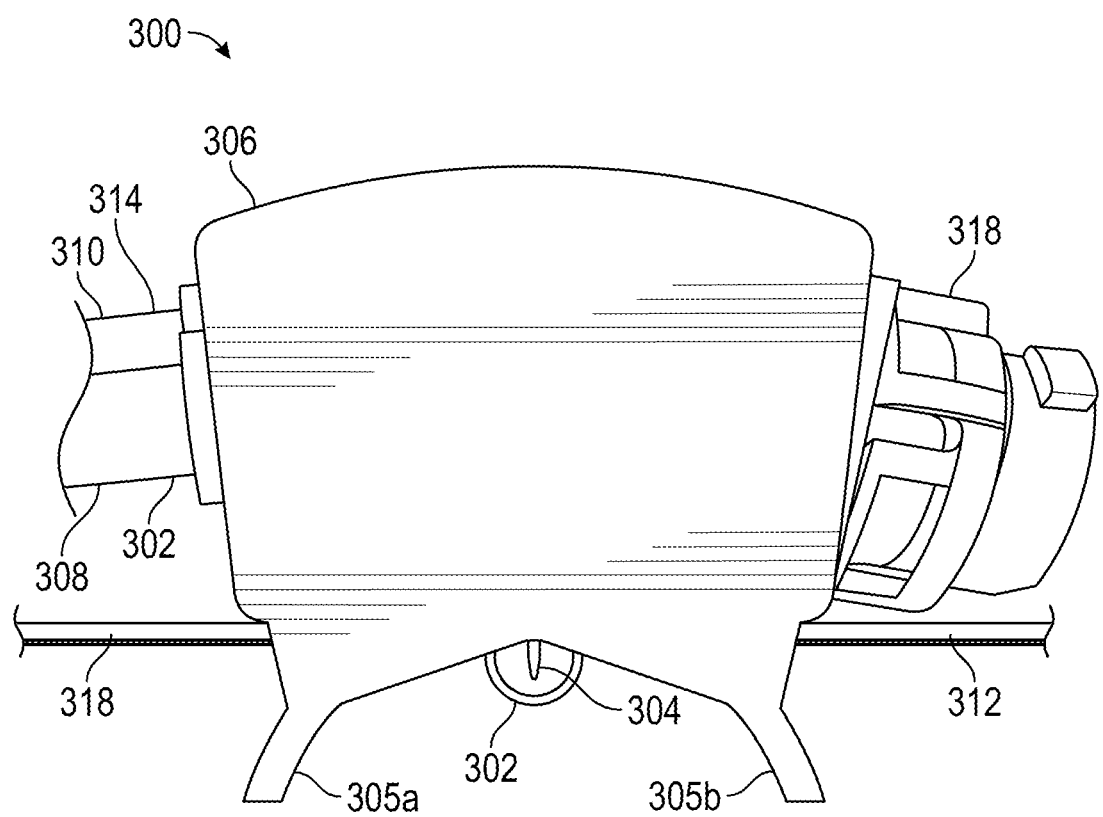
FIG. 3 is a side elevation view of an electricity monitoring device, according to another embodiment of the present disclosure.

FIG. 3 is an electricity monitoring device 300, according to another embodiment of the present disclosure. The electricity monitoring device 300 may be identical to or similar in some respect to the electricity monitoring device 100 of FIG. 1 or the electricity monitoring device 200 of FIG. 2. Accordingly, like features may be designated with like reference numerals, with the leading digits incremented to "3". Relevant disclosure set forth above regarding similarly identified features thus may not be repeated hereafter. Moreover, specific features of the electricity monitoring device 300 may not be shown or identified by a reference numeral in the drawings or specifically discussed in the written description that follows. However, such features may clearly be the same, or substantially the same, as features depicted in other embodiments and/or described with respect to such embodiments. Accordingly, the relevant descriptions of such features apply equally to the features of the electricity monitoring device 300. Any suitable combination of the features and variations of the same described with respect to the electricity monitoring devices 100 and 200 can be employed with the electricity monitoring device 300, and vice versa. This pattern of disclosure applies equally to further embodiments depicted in subsequent figures and described hereafter.

The electricity monitoring device 300 can include a protector 302, a measuring conductor 304, a pair of guides 305a, 305b (generally or collectively guides 305), a housing 306, and a securement mechanism 312.

Figure 4A:
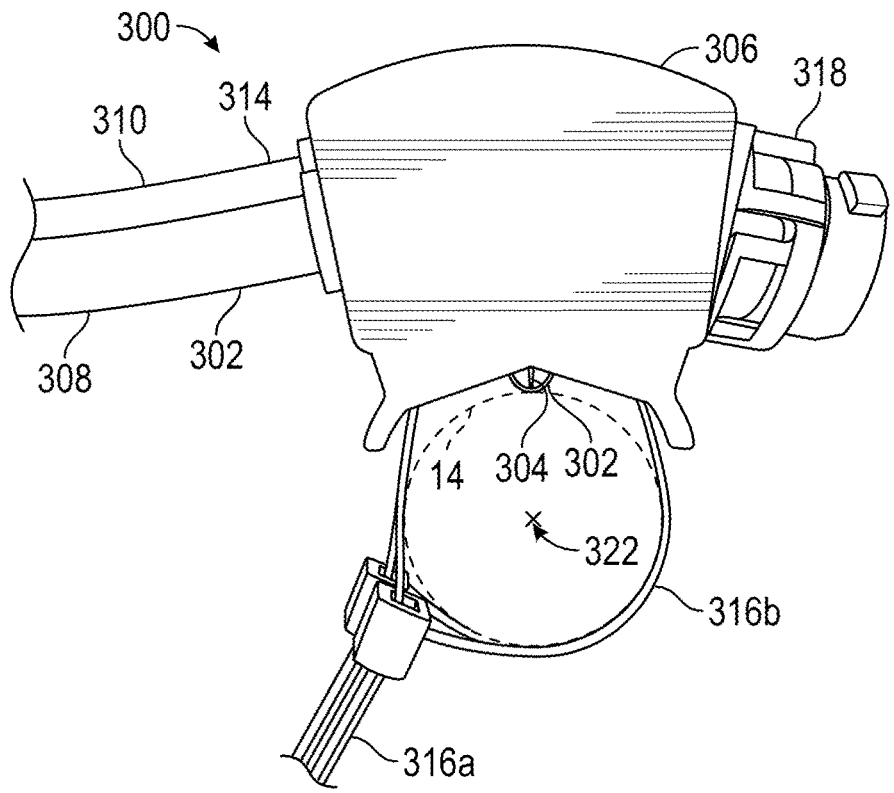
FIGS. 4A-4B are side elevation views of an electricity monitoring device, in an inoperative state and an operative state, respectively, according to some embodiments of the present disclosure.
Figure 4B:
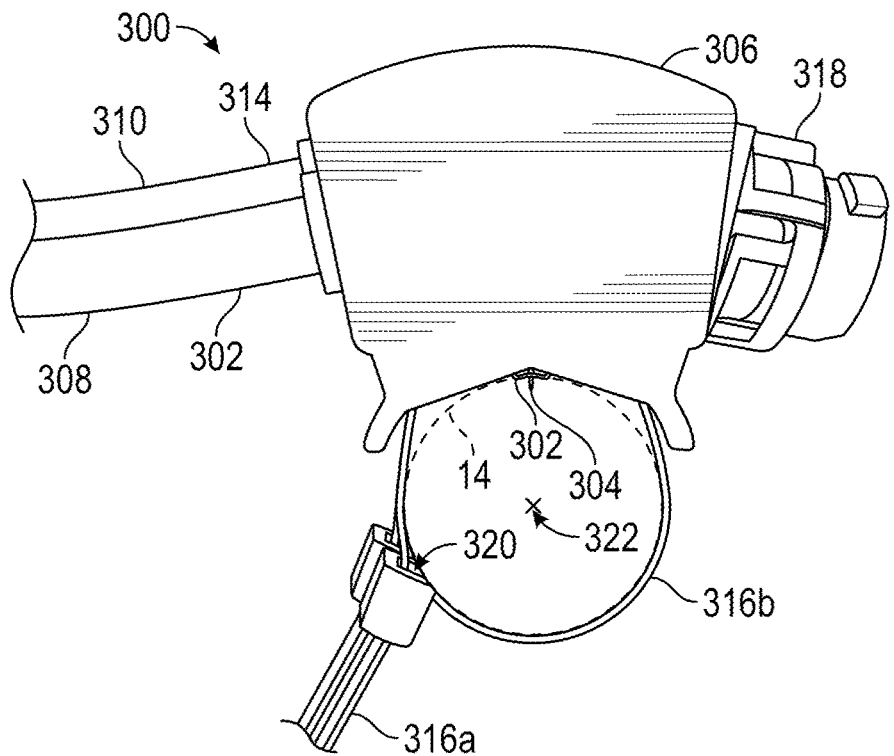

In some embodiments, as illustrated in FIG. 3, the measuring conductor 304 can be small enough as to be protected by the protector 302, in an inoperative position (as illustrated in FIG. 4A) withdrawn inside a protector 302 (e.g., a protection-mechanism) when the Rogowski coil is not positioned around a monitored energy source (e.g., monitored energy source 14a of FIG. 1). In some embodiments, when the electricity monitoring device 300 is in the inoperative position the measuring conductor 304 is configured to be disposed at least partially inside the protector 302. In some embodiments, the protector 302 is formed of a material sufficiently flexible to be deformed for piercing or penetration by the measuring conductor 304 while in the operative state (as illustrated in FIG. 4B, with the housing 306 positioned against a monitored energy source and the securement mechanism 312 tightened to secure the housing 306 and the measuring conductor 304 against the monitored energy source). For example, the protector 302 may be formed of plastic, flexible polyvinyl chloride (PVC), and/or other like materials. In some embodiments, the protector 302 is sufficiently flexible to substantially return to its original unbiased shape in the inoperative state in response to the measuring conductor 304 being released from its coupling with the monitored energy source. In some embodiments, the protector 302 may be formed in different geometrical shapes, such as, for example, a cylindrical, triangle, rectangular, and/or octagonal shape.

In some embodiments, the monitored energy source may have an insulation layer at least partially disposed thereon. The installed measuring conductor 304 (when in the operative state) is configured to pierce and/or otherwise extend through the insulation layer of the monitored energy source and to plastically deform the insulation layer enough to electrically couple to the monitored energy source and the measuring conductor 304. Such piercing is performed in a minimally invasive manner, e.g., the insulation layer of the monitored energy source can elastically recover upon removal of the measuring conductor 304.

The measuring conductor 304 provides electrical coupling to the monitored energy source and can draw sufficient electricity (e.g., less than 10 milliamps) to power a controller (e.g., controller 500 of FIG. 5) or an associated device while the electricity monitoring device 300 delivers a synchronized voltage measurement. Such electricity is insufficient to substantially interfere with voltage measurement of the electrical energy obtained from the monitored energy source. In some embodiments, the voltage and/or current drawn by the measuring conductor 304 is sufficient to power the controller, including the wireless transmitter, but is insufficient to interfere with voltage and current measurements taken by the electricity monitoring devices 300 from the monitored energy source.

The plastic deformation of the insulation layer of the monitored energy source is sufficiently minimal that a user's body is not at any greater risk of electric shock from the monitored energy source when the measuring conductor 304 is removed, substantially in a non-intrusive manner, from the tapped wire or energy source that is monitored. Therefore, the electricity monitoring device 300 may be installed to monitor and thereby be positioned around high voltage conductors or energy sources.

If the measuring conductor 304 is removed from monitoring the energy source, the insulation layer of the energy source can elastically return to its original shape such that the opening (e.g., aperture or slit) is substantially closed thus preventing or substantially reducing a risk of electric shock to a user of the safe harness or the electricity monitoring device 300. Additionally, the user's body is not at a greater risk of electric shock from the monitored energy source because the measuring conductor 304 (e.g., the tip) is protected by the protector 302 on the underside of the electrical component 302, for example, the Rogowski coil 308. Also, the installation process is performed in an "open-circuit" position of the electricity monitoring device 300.

The measuring conductor 304 can be formed of a rigid electrically conductive material. The measuring conductor 304 and/or the material can be capable of maintaining a relatively stable needle point (e.g., the point of the measuring conductor 304 that can pierce the monitored energy source and/or its insulator). Generally, the same or substantially similar materials as the materials from which the sewing machine needles are formed can be used. In some embodiments, a relatively hard non-ductile or metal having the relatively lower ductility, such as titanium or a like material can be used for forming the measuring conductor 304. The measuring conductor 304 can be shaped such that it pierces and leaves a relatively small slit in the monitored energy source. In some embodiments, the measuring conductor 304 can be shaped such that it pierces the external insulation formed of e.g., a polymer and/or rubber material, deforming and spreading and/or elongating the polymer chains/fibers without substantially cutting or breaking them and leaving a relatively small aperture when the measuring conductor 304 is extracted. For example, the measuring conductor 304 may have a shape of a vampire tooth or spike. Such measuring conductor 304 can tap or pierce the monitored energy source (in some embodiments, through the insulation layer) with minimal intrusion such that the energy source stays safe (e.g., the quality of the insulation is maintained) if the measuring conductor 304 were later removed, the opening from the earlier tapping or piercing is not accessible to a user not having special tools (e.g., electrical taping to cover the access point, is not needed). For example, regulatory organizations, such as Underwriter Laboratories (UL) and/or Occupational Safety and Health Administration (OSHA), permit an exposed metal energy source as long as a certain size of an airgap is not exceeded and if the opening in the insulation is sufficiently small (typically less than 5 mm, e.g., less than a width of the finger) or otherwise does not exceed a certain size such that, for example, a finger of the user could not protrude or be forced into the opening to reach the energy source. For example, in some embodiments, the diameter of the measuring conductor 304 does not exceed 2.5 mm. According to some embodiments, the intrusive opening in the insulation layer is less than 5 mm. For example, the opening can be 2 mm.

In some embodiments, in order to penetrate the insulation around the energy source, the measuring conductor 304 may be formed having a size that is 150% taller than the maximum insulation thickness formed according to the industry standards. As an example, some commercial-industrial buildings may use 200-350 MCM (e.g., 200,000-350,000 circular mils) feeder cable, which may have an average thickness of the insulation 2.54 mm. For the insulation surrounding the monitored energy source along its length, the height of the measuring conductor 304 can be at least: 2.54 mm multiplied by 150%, that is equal to 3.81 mm (e.g., rounding up to 4.0 mm the length of the portion of the measuring conductor 304 extending from the housing 306 and the collapsed protector 302 while in the operative state). Advantageously, such minimally invasive measuring conductor 304 can also facilitate substantially uncompromised mechanical integrity of the monitored energy source when the measuring conductor 304 is removed.

In some embodiments, the electricity monitoring device 300 may not have the housing 306. In such embodiments, the measuring conductor 304 can be disposed on the inside-bottom portion of the electrical component 302, for example, the Rogowski coil 308, e.g., where a stiff over-molding of the Rogowski coil 308 is disposed and where the sensing cables are attached to the Rogowski coil 308. This location for disposing the measuring conductor 304 is also a preferred location for the measuring conductor 304 (e.g., the vampire tooth) because this location is proximate to the monitored energy source. Additionally or optionally, this location also provides a relatively secure area to create a stronger rigid (e.g., metal) frame coupled to the measuring conductor 304. For example, the relatively secure area may be an area that is over-molded and secured to the electricity monitoring device 300 (e.g., a relatively thick and rigid portion of the electrical component 302, e.g., of the Rogowski coil 308).

Having discussed the measuring conductor 304 and the protector 302, attention is now directed to the housing 306 illustrated in FIG. 3. The housing 306 can be formed such that it has two ends or guides 305a and 305b spaced apart from each other and disposed on each side of the measuring conductor 304 at locations similar to those indicated in FIG. 3. The guides 305 are formed such that they substantially encircle the monitored energy source so as to facilitate orthogonality and a relatively more stable position of the monitored energy source while the housing 306 is being secured to the monitored energy source (e.g., while the securement mechanism 312 is tightened). The guides 305a, 305b can prevent or substantially reduce pivoting of the measuring conductor 304 while it is being moved radially inward toward a transverse cross-section center of the monitored energy source (e.g., when the measuring conductor 304 is transitioned to the operative state, as, for example, illustrated in FIG. 4B).

In some embodiments, there may be an additional pair of the guides 304 in another plane parallel to the main radial plane, i.e., behind the guides 305a and 305b. Alternatively or optionally, the guides 304 may be formed such that they extend along the housing edges 222 that in FIG. 3 go in and out of the page (see also, FIG. 2). Thus, a shape of the housing 306 having the housing guides 305 may substantially guide the measuring conductor 304 radially toward the cross-section center (e.g., a transverse cross-section center) of the monitored energy source of an appropriate diameter. According to some embodiments, a cross-section area of the monitored energy sources bundled into an array of energy sources having one phase can be, for example, up to or equal to 600 square mm, e.g., using the Rogowski coil 308 that may have a circumference of 24 inches wrapping around a cumulative 600 MCM (600,000 circular mils) comprising one or more energy sources having one phase.

FIGS. 4A-4B are side elevation views of the electricity monitoring device 300 of FIG. 3. FIGS. 4A-4B illustrate respectively the inoperative and operative states of the electricity monitoring device 300, and specifically the inoperative and operative states of the protector 302 and the measuring conductor 302. For example, as illustrated in FIG. 4A, the electricity monitoring device 300 is in an inoperative state when a loop of the electrical component 302 (e.g., the Rogowski coil 308) is not tightly secured to a monitored energy source (e.g., not fully connected around the one or more monitored energy sources 14). For example, in the inoperative state, the Rogowski coil 308 can be completely open, i.e., the closing connector 318 of the Rogowski coil 308 is not physically and/or electrically coupled to the other elements of the Rogowski coil 308 disposed within the housing 306 even when the Rogowski coil 308 may surround the monitored energy source 14. In some embodiments, in the inoperative state, the Rogowski coil 308 can be closed around the monitored energy source 14 (e.g., the closing connector 318 of the Rogowski coil 308 is physically and/or electrically coupled to the housing 306) but the measuring conductor 304 is not electrically coupled to the monitored energy source 14.

In some embodiments, as illustrated in FIG. 4B, the electricity monitoring device 300 is in the operative state when a loop of the electrical component 302 (e.g., the Rogowski coil 308), is closed relatively tightly (e.g., connected around the one or more monitored energy sources 14), and also when the measuring conductor 304 is electrically coupled to the monitored energy source 14. In some embodiments, for example, the measuring conductor 304 is disposed at or near the point where an inner perimeter of the Rogowski coil 308 comes in contact with at least one of the monitored energy sources 14 of each phase. The measuring conductor 304 may generally extend from the housing 306 or be positioned on or in a close proximity to a closing connector 318 of the Rogowski coil 308 (e.g., where the closing connector 318 is extended from the housing 306) at a location similar to that indicated in FIG. 4B.

Reference is now made to a securement mechanism 212, 312 illustrated in FIGS. 2, 3, and 4A-4B. In some embodiments, the securement mechanism 212, 312 can be a fastener for physically coupling the electricity monitoring device 200, 300 (and specifically the housing 206, 306) and the monitored energy source 14. More particularly, as illustrated in FIGS. 4A-4B, in some embodiments, the securement mechanism 312 may be configured to secure at least partially a portion of the electrical component 302 (e.g., the Rogowski coil 308) and housing 306, from which the measuring conductor 304 extends, to an appropriate position on one energy source (e.g. wire, cable, bus bar) of the monitored energy source 14 (e.g., a phase). The securement mechanism 312 may also operate to extend or otherwise transition the measuring conductor 304 into an operative position to pierce the monitored energy source 14 (e.g., conductive member) so as to become electrically coupled to the monitored energy source 14. In some embodiments, the insulating layer of the monitored energy source 14 and/or the protector 302 may be pierced or penetrated when the securement mechanism is at least partially tightened around the monitored energy source 14. Release of the securement mechanism 312 (when, for example, the securement mechanism 312 is returned to its unbiased state) may in turn cause or allow retraction of the measuring conductor 304 within the protector 302.

For example, in some embodiments, the securement mechanism 312 may have one or more longitudinal members that can be circled or wrapped around the monitored energy source 14 such that a main radial plane defined by a diameter of the electrical component 302 (e.g., the Rogowski coil 308) is substantially orthogonal to a central axis 322 (e.g., a longitudinal axis 322) of the monitored energy source 14 as illustrated in FIGS. 4A-4B. The longitudinal member of the securement mechanism 312 can be, for example, a relatively flat element having a certain width to facilitate the substantially orthogonal position of the monitored energy source 14 that is encircled by the longitudinal member of the securement mechanism 312. In other embodiments, there may be two or more longitudinal members of the securement mechanism 312 providing a support for the monitored energy source 14 disposed therewithin to achieve the substantially orthogonal position as to the main radial plane of the electrical component 302 (e.g., the Rogowski coil 308). Thus, a more precise and radial movement of the measuring conductor 304 toward the central axis 322 of the monitored energy source 14 is achieved when the securement mechanism 312 facilitates the substantially orthogonal position between the central axis 322 of the monitored energy source 14 and the main radial plane defined by a diameter of the electrical component 302.

In some embodiments, the fastener of the securement mechanism 212, 312 may be a cable tie 216, 316, such as the one illustrated in FIGS. 2, 3, and 4A-4B. For example, during securement of the cable tie 316 around the monitored energy source 14, a portion 316b (that is a portion of the cable tie 316 that at least partially surrounds the monitored energy source 14 on one side) has an opening 320 (also generally denoted 220 in FIG. 2) such that another portion 316a of the cable tie 316 is fed through opening 320 and tightened around the monitored energy source 14 such that the measuring conductor 304 starts piercing the monitored energy source 14 (after penetrating the protector 302 and/or insulation of the monitored energy source 14, if, e.g., the protector 302 and/or insulation layer are present). In some embodiments, one of the portions 316a and/or 316b of the cable tie 316 may wrap around the monitored energy source at least once before the portion 316a of the cable tie 316 is fed through opening 320 and tightened around the monitored energy source 14.

In some embodiments, the fastener of the securement mechanism 312 can be a hook and loop connection. In some embodiments, the fastener of the securement mechanism 312 can include one or more clamps. In some embodiments, the fastener of the securement mechanism 312 can be a snap-fit mechanism or a tongue and groove connection. In some embodiments, the fastener of the securement mechanism 312 can be a nut and bolt connection. In some embodiments, the fastener of the securement mechanism 312 can be a detent.

The electricity monitoring devices 300 having the described above features of safe harnessing enables safe installation and/or removal of the electricity monitoring device 300 to monitor a monitored energy source 14 (e.g., an electrical conductor), even when the energy source 14 has high voltage. For example, such installation and/or removal of the electricity monitoring device 300 may each take only several minutes, e.g., up to three (3) minutes.

Figure 5:
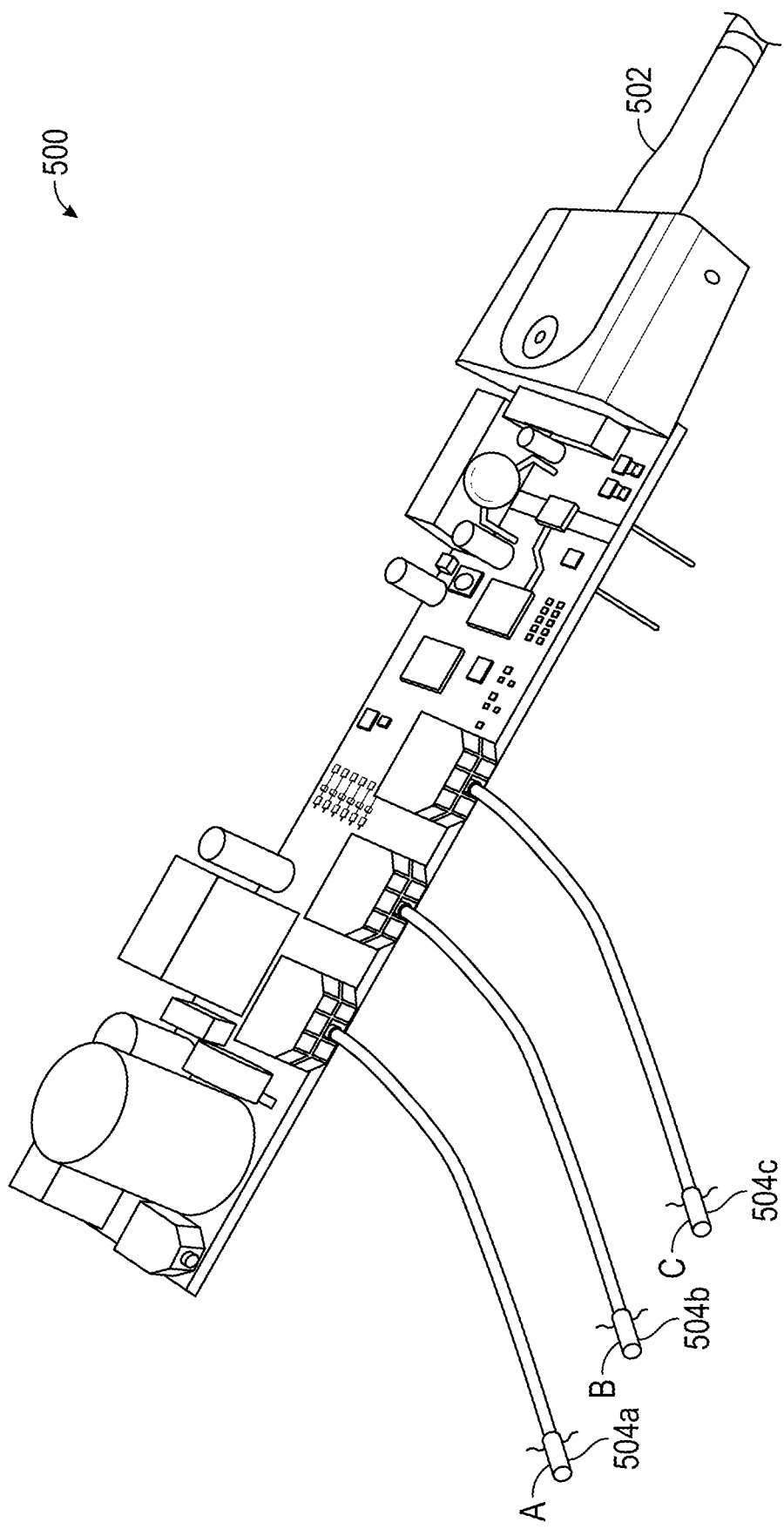
FIG. 5 is a controller of an electricity monitoring device, according to an embodiment of the present disclosure.

FIG. 5 is a controller of an electricity monitoring device, according to an embodiment of the present disclosure. FIG. 5 illustrates selected circuitry components of a controller 500. The controller 500 can monitor an individual energy source (e.g., energy source 14 of FIGS. 4A-4B) and/or up to three-phase energy sources. The controller 500 can include, for example, a processing circuitry and delivery circuitry.

The controller 500 can include a wireless communication transmitter (or transceiver) to transmit monitoring data. For example, the controller 500 may include a LoRa transmitter, a Sigfox transmitter, or an Ethernet-connected solution. A wireless transmitter antenna 502 is disposed at one of the ends of the controller 500, as illustrated in FIG. 5.

In some embodiments, during installation one or more of the three phases may be coupled to a plurality of the electricity monitoring devices that include the coupling cables having one or more of first ends. In some embodiments, ports 504a, 504b, and 504c that are extended from the controller 500 can be electrically coupled to the three electricity monitoring devices (e.g., each electricity monitoring device corresponding to each phase of a three-phase energy sources). For example, the opposite second end of the coupling cable may be further electrically coupled with one or more connectors 504.

The controller 500, in one embodiment, can in present time (e.g., real-time, run-time) detect, read, and/or measure electrical current and/or voltage in the monitored energy source. For example, the controller 500 may take a present sample or reading to measure electric current and/or voltage in the monitored energy source based on induction, voltage, and/or current in the delivery circuitry. The controller 500 may be powered by the energy released from an energy storage device. The controller 500 may include a power management circuitry to receive a release of energy from the energy storage device.

The controller 500 may include one or more general purpose devices, such as a standard microprocessor. The controller 500 may include a special purpose processing device, or other customized or programmable device. The controller 500 may run a standard operating system and perform standard operating system functions. The controller 500 may include a network interface and/or wireless network interface to facilitate communication with other computing devices and/or networks, such as the Internet and/or other computing and/or communications networks.

The controller 500 may transmit information to another computing device and/or a network (e.g., the Internet). In some embodiments, the transmission may be by wireless protocol via a wireless technology. The transmission may include data indicating a measurement taken of the current and/or voltage in the monitored energy source 14. In this manner, current and/or voltage in the monitored energy source 14 can be monitored and/or measured remotely (e.g., from a remote operation center). Further, the measurements of the current and/or voltage can be processed remotely from the monitored energy source 14. Data concerning the current and/or voltage in the monitored energy source 14 can also be presented to a remote user, such as via an application on a mobile device. In other embodiments, the data may be presented via other user interfaces, including but not limited to a web interface, a compiled program, a downloadable spreadsheet, API, on-board screens, sounds, alerts, notifications, and the like.

The controller 500 may also receive a transmission of information, such as from the network and/or the other computing device. The transmission may include instructions, software and/or firmware updates, settings, and the like.

As can be appreciated, in other embodiments, the controller 500 may include any variety of a consumptive circuit (e.g., consumptive of energy) that performs operations to accomplish a variety of functions in addition to or other than detection and/or measurement of current and/or voltage in the monitored energy source 14 (or monitored energy source). For example, the controller 500 may simply provide a transmission of data. The controller 500, in some embodiments, may gather voltage and/or current data for more than one monitored energy source at a time. In another embodiment, the controller 500 can infer from the elapsed time during an off-state how much current was consumed and for how long. This may be accomplished by knowing the amount of current (through the monitored energy source) to charge the energy storage system and obtaining timestamps of the last read and the immediate activation timestamp. As a result, the controller 500 can draw an inference as to how much time elapsed to consume the requisite base current load on the monitored energy source 14 between reads. In other words, the electricity monitoring device may evaluate energy while in an off-state by considering that the system requires a certain amount of energy to power up again, therefore enabling deduction (e.g., given timestamps of last measure and next measure) that a known energy amount occurred while the electricity monitoring device was charging. The electricity monitoring device may provide present readings (e.g., run-time readings, real-time readings) while the electricity monitoring device, and specifically the controller 500, is powered, and accumulated data (while the electricity monitoring device is charging).

In some embodiments of the electricity monitoring device, the timestamps of the moments when the voltage and/or current were obtained by the electrical component and/or the measuring conductor from the energy source may be recorded and further analyzed, for example, to synchronize the data indicative of the voltage and/or current, or any other electricity data associated with a particular moment of time when the data was obtained. The timestamps may be registered and analyzed (e.g., synchronized) by the controller 500 in run-time or real-time. In some embodiments, a data package containing the timestamps can be further transmitted via the LoRa transmitter, the Sigfox transmitter, or the Ethernet-connected solution. In some embodiments, the data may be received by the server, a monitoring hub, and the like devices that can be configured to perform such synchronization of data (including the data indicative of the obtained voltage and/or current). The synchronization may facilitate delivery to the user of a wide variety of data points synchronized with respect to the particular moment of time and/or analysis of the data corresponding to a plurality of timestamps, such as, historical data, predictive patterns, volumes/intensities, and the like.

In some embodiments, processing functionality provided by the controller 500 may be performed by the other computing device, or some other remote computing device (e.g., a current and/or voltage monitoring hubs or other computing device such as in a cloud computing environment).

Figure 6:
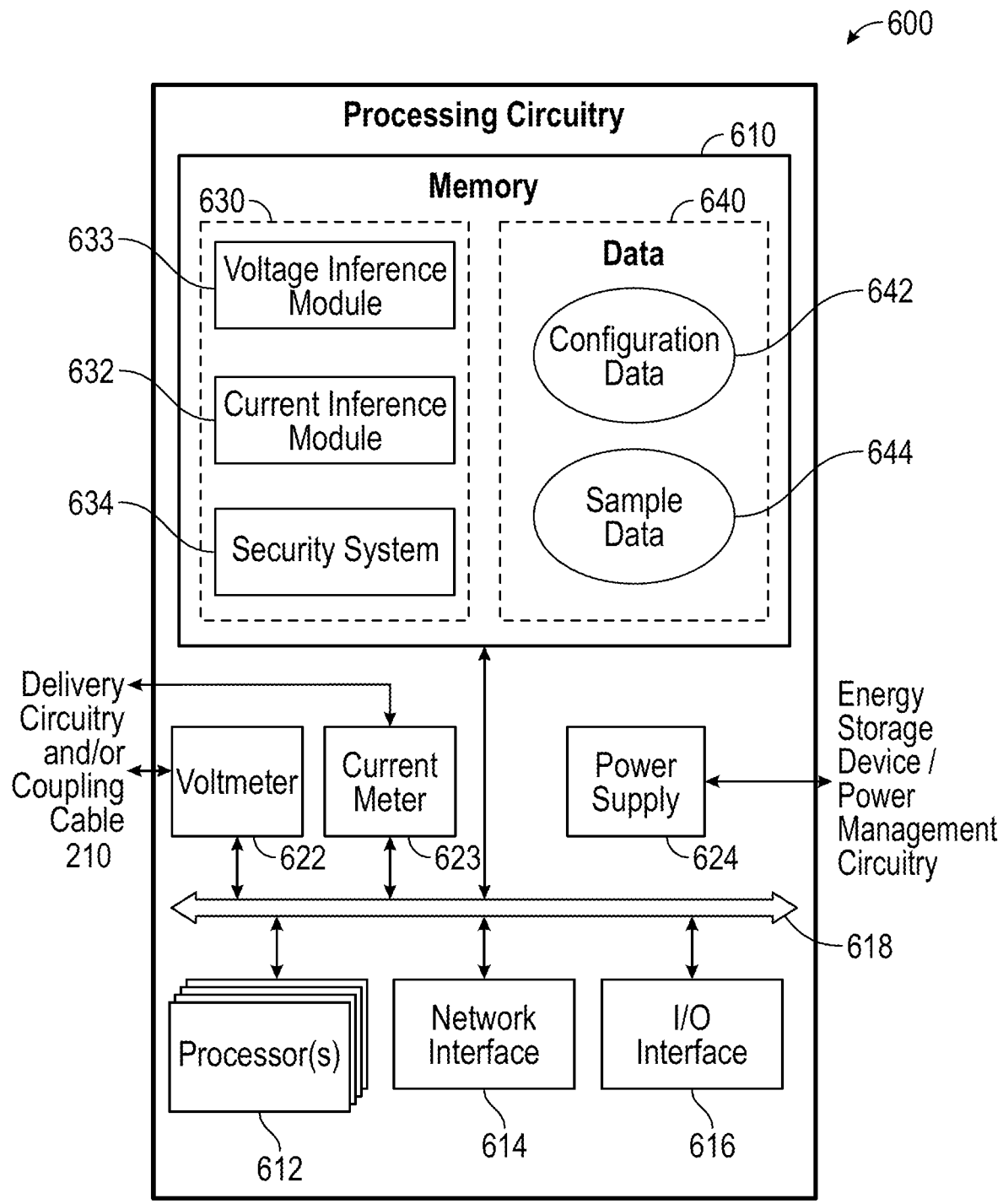
FIG. 6 is a block diagram of processing circuitry of a controller of an electricity monitoring device, according to one embodiment of the present disclosure.

FIG. 6 is a block diagram of processing circuitry 600 of an electricity monitoring device, according to one embodiment of the present disclosure. As illustrated in FIG. 6, the processing circuitry 600 may include electronic memory 610, one or more processors 612, a network interface 614, an I/O interface 616, a voltmeter 622, a current meter 623 (e.g., an ammeter), and a power supply 624. The electronic memory 610 may include static RAM, dynamic RAM, flash memory, one or more flip-flops, or other electronic storage medium. The electronic memory 610 may include a plurality of modules 630 and data 640. The modules 630 may include all or portions of other elements of the device. The modules 630 may run multiple operations serially, concurrently or in parallel by or on the one or more processors 612.

In some embodiments, portions of the disclosed modules, components, and/or facilities are embodied as executable instructions embodied in hardware or in firmware, or stored on a non-transitory, machine-readable storage medium. The instructions may comprise computer program code that, when executed by a processor and/or computing device, cause a computing system to implement certain processing steps, procedures, and/or operations, as disclosed herein. The modules, components, and/or facilities disclosed herein may be implemented and/or embodied as a driver, a library, an interface, an API, FPGA configuration data, firmware (e.g., stored on an EEPROM), and/or the like. In some embodiments, portions of the modules, components, and/or facilities disclosed herein are embodied as machine components, such as general and/or application-specific devices, including, but not limited to: circuits, integrated circuits, processing components, interface components, hardware controller(s), storage controller(s), programmable hardware, FPGAs, ASICs, and/or the like.

The modules 630 may include a current inference module 632, a voltage inference module 633, and a security system 634. The current inference module 632 may, by the one or more processors 612, perform operations to infer a current through a monitored energy source, based on readings from other components, such as the voltmeter 622. Additionally or optionally, the voltage inference module 633 may, by the one or more processors 612, perform operations to infer a voltage through a monitored energy source 14, based on readings from other components, such as the current meter 623 (e.g., ammeter). The security system 634 may securely encrypt the data 640 transmitted (e.g., to the access node).

The data 640 stored on the electronic memory 610 may include data 640 generated by the processing circuitry 600, such as by the program modules 630 or other modules. The stored data 640 may be organized as one or more memory registers/addresses, files, and/or databases. The data 640 may include configuration data 642 and sample data 644.

The one or more processors 612 may include any computing circuitry to perform operations to detect, measure, and/or infer a voltage and/or current within an energy source, based on inductance and/or minimally invasive tapping by the measuring conductor of the monitored energy source 14. The one or more processors 612 may include general purpose processors and/or special purpose processors. In one embodiment, the one or more processors 612 include a LoRa® chip and/or a Bluetooth® chip to provide special purpose transmit (Tx) and/or receive (Rx) functionality for communicating with other computing devices. Alternatively or in addition, these special purpose Tx/Rx chips may supplement and/or be included in the network interface 614.

The network interface 614 may facilitate communication with other computing devices and/or networks, such as the Internet and/or other computing and/or communications networks. The network interface 614 may be equipped with conventional network connectivity. The network interface 614 may be a wireless network interface, equipped with conventional wireless network connectivity technologies. For example, the network interface 614 may interface with a LoRa wireless network, a WiFi wireless network, and/or a Bluetooth wireless network, etc.

The I/O interface 616 may facilitate interfacing with one or more input devices and/or one or more output devices.

A system bus 618 may facilitate communication and/or interaction between the other components of the processing circuitry 600, including the electronic memory 610, the one or more processors 612, the network interface 614, the I/O interface 616, and the voltmeter 622 and/or ammeter 623.

The voltmeter 622 and ammeter 623 can be coupled to the delivery circuitry, the measuring conductor, and/or to an inductive energy transfer electrical component so as to measure a current and/or voltage, for example, across a coupling cable 210 within which an electromotive force is induced via an inductive energy transfer electrical component and/or obtained by the measuring conductor. As described above, for example, a fluctuating current within a monitored energy source can produce an electromagnetic field within an inductive energy transfer electrical component. The electromagnetic field in turn produces an electromotive force in the coupling cable 210 that causes current and/or voltage in the coupling cable 210. The voltmeter 622 and/or ammeter 623 can read or measure the voltage and/or the current in the coupling cable 210. The measurement of the voltmeter 622 and/or ammeter 623 as to voltage and/or current in the circuit can be used (e.g., by the current inference modules 632 and/or voltage inference module 633, respectively) to infer current and/or voltage, respectively, in the monitored energy source.

In some embodiments, electrical energy may be harvested (e.g., by inductance via an inductive electrical component and/or by tapping voltage of the monitored energy source) and may be stored in an energy storage device, such as a battery, a capacitor, or other energy storage device. The electrical energy that is stored may be released from the energy storage device for use. For example, the electrical energy may be released upon a predetermined threshold level of stored electrical energy being achieved. The electrical energy may be released from the energy storage device to power a processing circuitry 600.

The power supply 624 may receive stored energy released from the energy storage device, for example, via the power management circuitry. The power supply 624 may distribute the received energy through the processing circuitry 600 to power the various components. Stated otherwise, at a receipt of energy, the power supply 624 can power up the processing circuitry 600.

As can be appreciated, in other embodiments, the processing circuitry 600 may be simpler than shown or described. For example, certain designs may forego one or more components, such as memory, multiple processors, multiple interfaces, and the like, and instead execute instructions closer to or on bare metal (e.g., without intervening operating system or other software layer, executing instructions directly on logic hardware).

The processing circuitry 600 may be electrically coupled to a delivery circuit. Coupling the delivery circuit and the processing circuitry 600 may enable or otherwise allow the processing circuit access to sample or measure a state of the monitored energy source, or an indication thereof. Specifically, one or more operations can be performed by the processing circuitry 600, to detect and/or measure an electrical current and/or voltage in the monitored energy source, based on the induction in the delivery circuit and/or voltage and/or current provided by the measuring conductor. For example, the operations may include obtaining a measurement of a voltage within the delivery circuit, from which current in the monitored energy source can be inferred based on Ohm's Law and/or power equations.

Upon completion of desired operations, the processing circuitry 600 may dump off any remaining energy stored in the energy storage device, so as to ensure a known quantity of energy is stored in the energy storage device for consideration during a subsequent cycle of the processing circuitry 600. The processing circuitry 600 may dump off energy by lighting a light emitting diode (LED), by powering a separate radio, beacon (e.g., a longer Bluetooth beacon), processing platform, or other use of the relocated energy surplus. As long as the energy is drawn out of the energy storage device, this surplus energy can be used as desired.

The delivery circuit can include a logic gate that can provide selective switching between a charging circuit to charge the capacitor and a provision circuit to provide electrical coupling to the analysis circuit. Stated otherwise, the logic gate of the delivery circuit can control or direct delivery of electric energy and/or current (e.g., induced in the wire or coupling cable 210) to either the capacitor or to the analysis circuit. The logic gate of the delivery circuit can respond (e.g., switch) based on a signal from the power management circuit. In other words, in some embodiments, the fluctuating magnetic field produced by the current transformer and/or the electrical component, such as a Rogowski coil, can induce an electromotive force in the wire or coupling cable 210, which can be propagated and directed or otherwise controlled by the delivery circuit to provide either electrical energy (e.g., electric current) to the energy storage device or electrical energy (e.g., voltage) to be analyzed by the analysis circuit. In other embodiments, current and/or voltage can be obtained by the measuring conductor via tapping the monitored energy source.

The energy storage device can be a capacitor that can store electrical energy produced by the induced electromotive force within the wire or coupling cable 210 and/or that is obtained by the measuring conductor via tapping the monitored energy source. For example, the capacitor may store a quantity of energy that is fixed, can be represented by a constant, or otherwise understood to be a fixed or predictable amount. The capacitor may be electrically coupled to and receive electric current and/or energy from the delivery circuit or the measuring conductor. The capacitor can store this energy and upon reaching a threshold level of energy storage, may release stored energy that can be used to power the analysis circuit.

In other embodiments, the energy storage device can be a battery that can store electrical energy.

The power management circuit may control or otherwise direct, command, or instruct operation of the delivery circuit. The power management circuit may include a relay (or other switch) to operate upon or at release of electrical energy from the capacitor. The relay may send a signal to the logic gate of the delivery circuit to cause the logic gate to switch delivery of induced electric current and/or energy between the capacitor and the analysis circuit. Stated otherwise, the relay of the power management circuit, in a first position, causes completion of the power management circuit to store energy in the capacitor and, in a second position, causes completion of a circuit to direct induced current and/or energy for analysis by the analysis circuit.

The power management circuit may also control release of electrical energy from the capacitor to power the analysis circuit. The analysis circuit, in one embodiment, may be a processing circuit that can detect and/or measure electrical current and/or voltage in the monitored energy source. For example, the analysis circuit may take a present run-time or real-time sample or reading to determine a measurement of electric current and/or voltage in the monitored energy source. Specifically, the analysis circuit may take a real-time sample or reading of voltage across the wire or coupling cable 210, such that current and/or voltage on the monitored energy source over a period of time can be inferred.

The capacitor may store a fixed, or otherwise predictable, amount of power (e.g., 90 milliwatts). A release of power from the capacitor may indicate the amount of power stored by the capacitor for a given period of time. A present run-time or real-time voltage reading can then be used to infer current.

In other embodiments, the analysis circuit may take a reading of voltage and/or current induced in the wire or coupling cable 210 by the monitored energy source.

As stated, the analysis circuit may be powered by energy released from the capacitor. The analysis circuit may be electrically coupled to the capacitor and/or the power management circuit to receive a release of energy from the capacitor.

The analysis circuit may include one or more general purpose and/or special purpose processing devices, or other customized or programmable device. The analysis circuit may run a standard operating system and perform standard operating system functions.

The analysis circuit may include a network interface and/or wireless network interface to facilitate communication with other computing devices and/or networks, such as the Internet and/or other computing and/or communications networks and/or interfaces. The analysis circuit may transmit (e.g., via a wireless protocol) information to an access node (e.g., a wireless access point or other computing device), which may be coupled to a network (e.g., the Internet). The transmission may include data indicating an ID (e.g., a Bluetooth ID, a device ID), and a measurement of the voltage and/or current in the monitored energy source. The transmission may be encrypted to aid in security. In turn, voltage and/or current in the monitored energy source can be inferred and/or monitored (e.g., measured) remotely (e.g., from a remote operation center). Further, the measurement of the voltage and/or current can be processed remotely from the monitored energy source. Data concerning the voltage and/or current in the monitored energy source can also be presented to a remote user, such as via an application on a mobile device.

The analysis circuit may also receive (e.g., via a wireless protocol) information, such as from the network, by way of the access node. The received information may include instructions, software and/or firmware updates, settings, and the like. For example, the received information may include an update to a security protocol and/or security system.

The electricity monitoring device embodiments described above are advantageous in a number of respects. For example, an electricity monitoring device, according to some embodiments of the present disclosure, can measure voltage and/or current throughput in the monitored energy source through a passive charging system. The electricity monitoring device harvests energy from the monitored energy source to then sample or measure voltage and/or throughput of current in the monitored energy source.

Existing current meters (such as, for example, ammeters) and devices and methods of measuring current typically operate only when powered on, such that when power is cut, or unavailable, the current meter cannot obtain a measurement.

By contrast, the present disclosure provides an analysis circuit that can, in effect, continue to monitor electrical current and/or voltage in the monitored energy source for a certain period even while not powered. The arrangement and operation of components of the disclosed electricity monitoring device enable unprecedented low power remote current and/or voltage monitoring.

As briefly stated above in some embodiments, one, two, or three phases may be monitored by a plurality of the electricity monitoring devices. For example, the plurality of the electricity monitoring devices can include a first electrical component (e.g., a first inductive energy transfer medium), a second electrical component (e.g., a second inductive energy transfer medium), an energy storage device, delivery circuitry, power management circuitry, and processing circuitry 600 that may, in turn, include the analysis circuit. The plurality of the electricity monitoring devices can be powered based on voltage and/or current (via induction) through a first energy source (e.g., a primary energy source) to monitor electricity current and/or voltage in a second energy source (e.g., a monitored energy source). The first energy source and the second energy source' may be wires, such as in a three-phase power line to a building. In other embodiments, the first energy source and/or the second energy source may be another type of energy source, such as, for example, transmission lines.

The first inductive energy transfer medium may be the inductive energy transfer electrical component, such as the Rogowski coil. An electromotive force is induced in the first electrical component by a fluctuating flow of electrical current in the first energy source. The electromotive force induced in the first electrical component is conducted within a wire or coupling cable of, for example, the delivery circuitry, to deliver electrical energy. Additionally or optionally, the first measuring conductor may obtain energy from the first energy source, and the received energy is further conducted within a wire or coupling cable of, for example, the delivery circuitry, to deliver electrical energy.

The delivery circuitry can provide electrical coupling of the first inductive energy transfer medium or electrical component to the energy storage device. In other words, for example, the fluctuating magnetic field produced by the first electrical component in turn induces an electromotive force in the delivery circuitry to provide electric current and/or voltage for delivery of electrical energy to the energy storage device. Additionally or optionally, the first measuring conductor may obtain energy from the first monitored energy source, and the received energy is further conducted to the delivery circuitry to provide electric current and/or voltage for delivery of electrical energy to the energy storage device.

The energy storage device stores electrical energy produced by the induced electromotive force or transferred from the measuring conductor. In one embodiment, the energy storage device may be a battery. In another embodiment, the energy storage device may be a capacitor. The energy storage device may store a quantity of energy that can be represented by a constant, or otherwise understood to be a fixed or predictable amount. The energy storage device, upon reaching a threshold level of energy storage, may release stored energy to the processing circuitry 600.

The power management circuitry may control or otherwise direct storage of the electrical energy in the energy storage device. In some embodiments, the power management circuitry may also control or otherwise direct a release of the electrical energy from the energy storage device. In one embodiment, the power management circuitry may include a relay that electromechanically or electronically opens and closes an electrical circuit of the power management circuitry.

The second electrical component may be a Rogowski coil. The second electrical component can produce a fluctuating magnetic field from a fluctuating flow of electrical current in the second monitored energy source. The fluctuating magnetic field can induce an electromotive force within a second coupling cable 210 (e.g., a wire), to produce electrical energy that can be sampled, measured, or otherwise analyzed by the processing circuitry 600, electrically coupled to the coupling cable 210. Additionally or optionally, the second measuring conductor may obtain energy from the second monitored energy source 14, and this received energy is further conducted within the second coupling cable 210 of, for example, the processing circuitry 600, to produce electrical energy that can be sampled, measured, or otherwise analyzed by the processing circuitry 600.

The processing circuitry 600, in one embodiment, can in present run-time or real-time detect and/or measure electrical current and/or voltage in the second monitored energy source. For example, the processing circuitry 600 may take a present run-time or real-time sample or reading to measure electric current and/or voltage in the second monitored energy source based on the voltage and/or current in the second coupling cable 210, and/or based on induction (e.g., a fluctuating magnetic field induced by the second electrical component) and/or based on current and/or voltage obtained by the second measuring conductor. As stated earlier, the processing circuitry 600 may be powered by the energy released from the energy storage device to perform the sampling, reading, and/or measuring operations, or to otherwise infer current and/or voltage in the second monitored energy source. The processing circuitry 600 may be electrically coupled to the power management circuitry to receive a release of energy from the energy storage device.

The processing circuitry 600 may include a network interface and/or wireless network interface to facilitate communication with other computing devices and/or networks, such as the Internet and/or other computing and/or communications networks. Specifically, the processing circuitry 600 may transmit (e.g., via a wireless protocol) information to an access node, which may in turn be coupled to a network (e.g., the Internet). The transmission may include data indicating a measure of the current and/or voltage in the second monitored energy source. In this manner, current and/or voltage in the second monitored energy source can be monitored and/or measured remotely (e.g., from a remote operation center). Further, the measurements of the current and/or voltage can be processed remotely from the second monitored energy source. Data concerning the current and/or voltage in the second monitored energy source can also be presented to a remote user, such as via an application on a mobile device.

The processing circuitry 600 may also receive a transmission (e.g., via a wireless protocol) of information from the network via the access node. The transmission may include instructions, software and/or firmware updates, settings, and the like.

In another embodiment, the processing circuitry 600 may simultaneously and/or independently monitor and/or measure the current and/or voltage in the first monitored energy source. A transmission may include data indicating the measure of the current and/or voltage in the first monitored energy source and the second monitored energy source. The measurements of the current and/or voltage can be processed remotely from the first monitored energy source and the second monitored energy source. Data concerning the current and/or voltage in both the first monitored energy source and the second monitored energy source can also be presented to a remote user, such as via an application on a mobile device.

In another embodiment, another electrical component may be utilized in proximity to a third monitored energy source for monitoring current and/or voltage in the third monitored energy source.

In still another embodiment, the delivery circuitry may electrically couple a plurality of inductive energy transfer electrical components and/or plurality of the measuring conductors to the processing circuitry 600 for monitoring. The delivery circuitry may control sampling (or measuring) to alternate between the first monitored energy source, the second monitored energy source, and the third monitored energy source. Any number of monitored energy sources may be monitored in this manner.

As can be appreciated, in other embodiments, the processing circuitry 600 may perform operations to perform a variety of functions in addition to or other than detection and/or measurement of current and/or voltage in the first, second, and/or third monitored energy sources, respectively. In some embodiments, unlike typical meters that involve thirteen or more electrical connections and a ground to perform similar monitoring functions, the processing circuitry 600 may be configured to be connected to the ground with only up to three harness connections or ground coupling cables (e.g., for the three phases of power/energy when coupling the three electricity monitoring devices).

According to one embodiment, a method of monitoring current and/or voltage in an energy source is disclosed. Electrical energy is produced, such as within a delivery circuit and/or a coupling cable 210, by induction and/or a measuring conductor electrically coupled to the monitored energy source. For example, an electrical component, such as a Rogowski coil, may be used to produce electrical energy by driving an electromotive force in a delivery circuit. The electrical component may produce the electromotive force from a fluctuating magnetic field generated from a fluctuating flow of electrical current in a monitored energy source.

According to an aspect of an embodiment, a controller (e.g., controller 500 of FIG. 5) that may include a processing circuitry 600 can measure a present run-time electrical voltage and/or current in the monitored energy source in response to the monitored energy source providing the electrical energy.

Figure 7A:
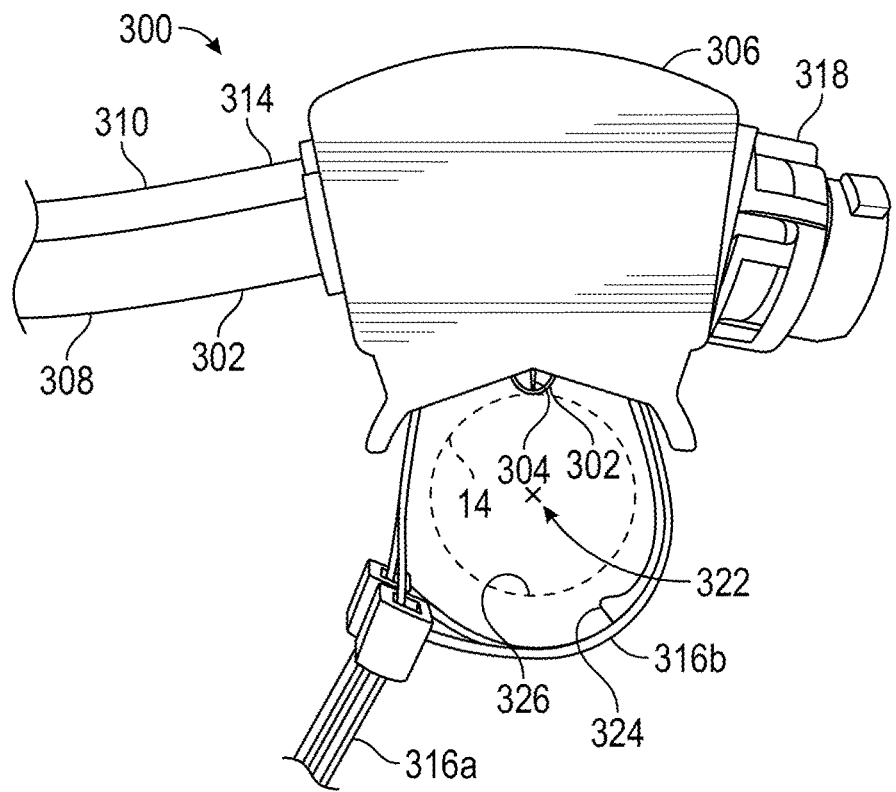
FIGS. 7A-7B are side elevation views of an electricity monitoring device, in an inoperative state and an operative state, respectively, according to some embodiments of the present disclosure.
Figure 7B:
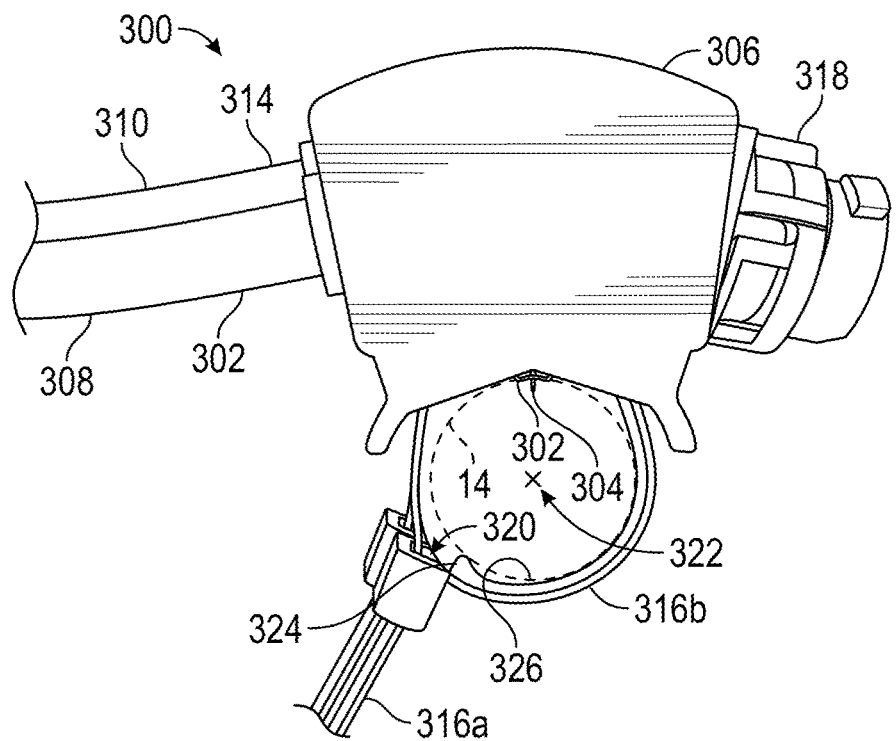

FIGS. 7A-7B are side elevation views of the electricity monitoring device 300, in an inoperative state and an operative state, respectively, according to another embodiment of the present disclosure. As illustrated in FIGS. 7A-7B, the securement mechanism 312 may have one or more lips 324 to guide the measuring conductor 304 radially inward toward a center of a cross-section of the monitored energy source 14. For example, FIGS. 7A-7B are side elevation views of an electricity monitoring device, in an inoperative state and an operative state, respectively, according to some embodiments of the present disclosure. In some embodiments, the electricity monitoring device 300 can have the securement mechanism 312 that includes the lips 324 that may have a convex curve profile. The lips 324 are formed such that they extend alongside one or more longitudinal members and facilitate movement of the energy source 14 toward the measuring conductor 304 when the electricity monitoring device 300 is changed from the inoperative state to the operative state. In some embodiments, as illustrated in FIG. 7B, the lips 324 can have relatively enlarged ends that are disposed in a minor arc, e.g., beyond an edge 326 of a semicircular arc of the cross-section of the energy source 14 where the semicircular arc of the cross-section is defined by the measuring conductor 304 on one of semicircular arc ends and a side of the cross-section that is surrounded by the lips 324.

A processor or processing device as used herein may include one or more general purpose devices, such as an ARM®, Intel®, AMD®, or other standard microprocessor, and/or one or more special purpose processing devices, such as ASIC, SoC, SiP, FPGA, PAL, PLA, FPLA, PLD, or other customized or programmable device. A processor or processing device can perform distributed (e.g., parallel) processing to execute or otherwise implement functionalities of the present embodiments. A processor or processing device may run a standard operating system and perform standard operating system functions.

Electronic memory as reference herein may include static RAM, dynamic RAM, flash memory, one or more flip-flops, ROM, CD-ROM, DVD, disk, tape, or magnetic, optical, or other computer storage medium. The electronic memory may include a plurality of program modules and/or a program data. The electronic memory may be local, or may be remote and/or distributed over a network.

An I/O interface as described herein may facilitate interfacing with one or more input devices and/or one or more output devices. The input device(s) may include a keyboard, mouse, touch screen, light pen, tablet, microphone, sensor, or other hardware with accompanying firmware and/or software. The output device(s) may include a monitor or other display, printer, speech or text synthesizer, switch, signal line, or other hardware with accompanying firmware and/or software.

A network interface as described herein may facilitate communication with other computing devices and/or networks, such as the Internet and/or other computing and/or communications networks/devices. The network interface may be equipped with conventional network connectivity, such as, for example, Ethernet (IEEE 802.3), Token Ring (IEEE 802.5), Fiber Distributed Datalink Interface (FDDI), or Asynchronous Transfer Mode (ATM), phone lines, modems in general, whether radio or wired. Further, the computer may be configured to support a variety of network protocols such as, for example, Internet Protocol (IP), Transfer Control Protocol (TCP), Network File System over UDP/TCP, Server Message Block (SMB), Microsoft® Common Internet File System (CIFS), Hypertext Transfer Protocols (HTTP), Direct Access File System (DAFS), File Transfer Protocol (FTP), Real-Time Publish Subscribe (RTPS), Open Systems Interconnection (OSI) protocols, Simple Mail Transfer Protocol (SMTP), Secure Shell (SSH), Secure Socket Layer (SSL), and so forth.

A wireless network interface as described herein may be equipped with conventional wireless network connectivity technologies, such as, for example, Wireless Personal Area Network (WPAN) technologies (e.g., IrDA, Bluetooth, IEEE 802.15.4a (Zigbee), and IEEE 802.15.3c (UWB)), Wireless Local Area Network (WLAN) technologies (e.g., IEEE 802.11a/b/g (Wi-Fi), proprietary MIMO products, and IEEE 802.11n), Wireless Metropolitan Area Network (WMAN) technologies (e.g., IEEE 802.16 Broadband Wireless Access WMAN standard (WiMAX) and IEEE 802.20 (Mobile WiMAX)), and Wireless Wide Area Network (WWAN) technologies (e.g., LoRaWAN, GSM/GPRS/EDGE, CDMA2000, 1×RTT, UMTS/HSDPA, LTE, CDMA EV-DO Rev.0/A, HSUPA and EV-DO Rec.C, satellite, sonar/sound, Z-wave, Sigfox, LPWAN, and so forth).

As can be appreciated, other methods and processes are available and included in the descriptions above describing operation of the system embodiments and are within the scope of the present disclosure.

EXAMPLE EMBODIMENTS

Some examples of embodiments of electricity monitoring are provided below.

Example 1

An electricity monitoring device, comprising: a measuring conductor electrically coupled to a monitored energy source (e.g., a wire) to detect/read voltage of the monitored energy source; an electrical component (e.g., an inductive energy transfer medium, such as a Rogowski coil or an inductive frequency panel (like Qi)) in which a fluctuating magnetic field is induced from a fluctuating flow of electrical current in the monitored energy source, the fluctuating magnetic field to produce an electromotive force to produce electrical energy; and a controller to be powered by the provided electrical energy, the controller coupled to the measuring conductor to determine a present run-time electrical voltage of the monitored energy source based on a reading of the measuring conductor.

Example 2

The electricity monitoring device of Example 1, further comprising transmitter circuitry to transmit indication of the electrical voltage of the monitored energy source.

Example 3

The electricity monitoring device of Example 1, wherein the electrical component detects/reads current flowing through the monitored energy source (corresponding to the electrical voltage), and wherein the controller is configured to determine a present run-time electrical current of the monitored energy source (corresponding to the present run-time electrical voltage).

Example 4

The electricity monitoring device of Example 3, further comprising a coupling cable to electrically couple the measuring conductor and the electrical component to the controller.

Example 5

The electricity monitoring device of Example 4, wherein the controller determines the voltage and current via the coupling cable.

Example 6

The electricity monitoring device of Example 4, wherein coupling cable is coupled to the measuring conductor and the electrical component at a first end and coupled to the controller at a second end, wherein the controller determines the voltage and current as passed through the coupling cable.

Example 7

The electricity monitoring device of Example 1, wherein the electrical component further comprises a Rogowski coil.

Example 8

The electricity monitoring device of Example 7, wherein the measuring conductor that extends radially inward to the monitored energy source is disposed in at least one of connecting end portions of the Rogowski coil.

Example 9

An electricity monitoring device, comprising: an electrical component in which a fluctuating magnetic field is induced from a fluctuating flow of electrical current in a monitored energy source, the fluctuating magnetic field to produce an electromotive force to provide electrical energy; a controller, further comprising processing circuitry to be powered by a first portion of the electrical energy, the processing circuitry to detect a present run-time electrical voltage in the monitored energy source; and a measuring conductor to electrically couple the monitored energy source and the controller.

Example 10

The electricity monitoring device of Example 9, wherein the measuring conductor is configured to pierce an insulation material surrounding the monitored energy source.

Example 11

The electricity monitoring device of Example 10, wherein an aperture that is formed in the insulation material in response to the piercing of the insulation material by the measuring conductor is such that the monitored energy source is inaccessible to be electrically coupled with a user.

Example 12

The electricity monitoring device of Example 10, wherein the measuring conductor is formed such that, in response to the measuring conductor being removed, the insulation material surrounding the monitored energy source is configured to elastically recover such that an aperture in the insulation material from piercing by the measuring conductor is substantially closed in response to the measuring conductor being removed.

Example 13

The electricity monitoring device of Example 9, wherein the electrical component transmits a first and second portions of the electrical energy obtained from the monitored energy source.

Example 14

The electricity monitoring device of claim 13, further comprising: delivery circuitry to control delivery of the first portion of the electrical energy to an energy storage device to be stored and delivery of the second portion of the electrical energy to the processing circuitry for detecting the present run-time electrical voltage in the monitored energy source.

Example 15

The electricity monitoring device of Example 9, further comprising a securement mechanism.

Example 16

The electricity monitoring device of Example 15, further comprising: one or more lips to guide the measuring conductor radially toward a center of the monitored energy source cross-section.

Example 17

The electricity monitoring device of Example 15, wherein the securement mechanism comprises a fastener for physically coupling the electricity monitoring device and the monitored energy source.

Example 18

The electricity monitoring device of Example 17, wherein the fastener further comprises a cable tie.

Example 19

The electricity monitoring device of Example 17, wherein the fastener further comprises a hook and loop connection.

Example 20

The electricity monitoring device of Example 17, wherein the fastener further comprises one or more clamps.

Example 21

The electricity monitoring device of Example 17, wherein the fastener further comprises a snap-fit mechanism.

Example 22

The electricity monitoring device of Example 17, wherein the fastener further comprises a tongue and groove connection.

Example 23

The electricity monitoring device of Example 17, wherein the fastener further comprises a nut and bolt connection.

Example 24

The electricity monitoring device of Example 17, wherein the fastener further comprises a detent.

Example 25

The electricity monitoring device of Example 9, further comprising a housing that the measuring conductor extends therefrom.

Example 26

The electricity monitoring device of Example 25 wherein the housing is formed such that a shape of the housing guides the measuring conductor radially toward a cross-section center of the monitored energy source.

Example 27

The electricity monitoring device of Example 9, further comprising: a protector.

Example 28

The electricity monitoring device of Example 27, wherein the measuring conductor in inoperative position is configured to be disposed at least partially inside the protector.

Example 29

The electricity monitoring device of Example 27, wherein the protector is sufficiently flexible to be deformed for piercing it by the measuring conductor in an operative state.

Example 30

The electricity monitoring device of Example 27, wherein the protector is sufficiently flexible to substantially return to its original shape in an inoperative state in response to the measuring conductor being released from its coupling with the monitored energy source.

Example 31

The electricity monitoring device of Example 27, wherein the protector is formed in a cylindrical shape.

Example 32

The electricity monitoring device of Example 9, wherein the electricity monitoring device monitors a change of a power-factor value of the monitored energy source.

Example 33

The electricity monitoring device of Example 9, configured to monitor at least one of power or energy, in response to coupling the electricity monitoring device and the monitored energy source.

Example 34

The electricity monitoring device of Example 9, wherein the electricity monitoring device measures true values of root mean square (RMS) of at least one of energy or power attributable to one or more cables of the monitored energy source.

Example 35

The electricity monitoring device of Example 13, wherein the first portion of the electrical energy is (i) sufficient to power the electricity monitoring device and (ii) insufficient to interfere with voltage measurement of the second portion of the electrical energy obtained from the monitored energy source.

Example 36

The electricity monitoring device of Example 9, wherein a ground cable of the electricity monitoring device is configured to be coupled through one, two, or three connections.

Example 37

The electricity monitoring device of Example 9, wherein the controller is configured to be coupled to more than one electrical component through more than one coupling cable to measure more than one phase of the monitored energy source.

Example 38

The electricity monitoring device of Example 9, wherein the coupling of the electricity monitoring device to the monitored energy source is performed when the electricity monitoring device is in an open circuit state.

Example 39

The electricity monitoring device of Example 9, wherein the first portion of the electrical energy is not greater than 10 milliamps.

Example 40

The electricity monitoring device of Example 9, wherein a fluctuating flow of an electrical current in the monitored energy source is alternating current (AC).

Example 41

An electricity monitoring device, comprising: an inductor in which a fluctuating magnetic field is induced from a fluctuating flow of electrical current in a monitored wire, the fluctuating magnetic field to produce an electromotive force to provide electrical energy; a controller further comprising processing circuitry to measure a present run-time electrical voltage in the monitored wire in response to the inductor providing power; and a measuring conductor to electrically couple the monitored wire and the controller and through which the processing circuitry is to detect the electrical voltage in the monitored wire.

Example 42

A method for monitoring electricity in an energy source, the method comprising: electrically coupling, through a measuring conductor, a monitored energy source to a controller, the controller further comprising a processing circuitry; producing electrical energy within an electrical component by induction, including driving an electromotive force in the electrical component from a fluctuating magnetic field generated from a fluctuating flow of electrical current in the monitored energy source; performing one or more operations by the processing circuitry, including measuring present run-time electrical voltage in the monitored energy source in response to the monitored energy source providing the electrical energy to power the processing circuitry.

Example 43

An electricity monitoring device, comprising: a measuring conductor to electrically couple to a monitored energy source to read voltage of the monitored energy source; an electrical component in which a fluctuating magnetic field is induced from a fluctuating flow of electrical current in the monitored energy source, the fluctuating magnetic field to produce an electromotive force to provide electrical energy; and a single coupling cable to couple to a controller to supply the electrical energy to the controller absent (or without causing or creating) reading distortion while the coupled controller can determine a present electrical voltage of the monitored energy source based on a reading of the measuring conductor.

Example 44

The electricity monitoring device of example 43, wherein the electrical component reads or otherwise detects the rate of current flowing through the monitored energy source (corresponding to the electrical voltage) while the fluctuating magnetic field is induced, and wherein the controller is further to determine a present run-time electrical current of the monitored energy source (corresponding to the present run-time electrical voltage).

Example 45

The electricity monitoring device of example 43, wherein the coupling cable is to electrically couple the measuring conductor and the electrical component to the controller.

Example 46

The electricity monitoring device of example 45, wherein the coupling cable can supply power to a controller without causing reading distortion simultaneously, while the controller determines the present run-time electrical voltage and the present run-time electrical current via the coupling cable.

Example 47

The electricity monitoring device of example 45, wherein coupling cable is coupled to the measuring conductor and the electrical component at a first end and coupled to the controller at a second end, wherein the controller determines the voltage and current as passed through the coupling cable.

Example 48

The electricity monitoring device of example 43, wherein the electrical component comprises a Rogowski coil.

Example 49

The electricity monitoring device of example 48, wherein the measuring conductor is disposed in at least one of connecting end portions of the Rogowski coil and extends radially inward from to the monitored energy source.

Example 50

The electricity monitoring device of example 43, further comprising a securement mechanism to physically couple the electricity monitoring device and the monitored energy source with the measuring conductor radially toward a center of the monitored energy source cross-section.

Example 51

The electricity monitoring device of example 43, wherein the measuring conductor is configured to pierce an insulation material surrounding the monitored energy source.

Example 52

The electricity monitoring device of example 51, wherein an aperture that is formed in the insulation material in response to the piercing of the insulation material by the measuring conductor is such that the monitored energy source is inaccessible to be electrically coupled with a user.

While the principles of this disclosure have been shown in various embodiments, many modifications of structure, arrangements, proportions, the elements, materials and components, used in practice, which are particularly adapted for a specific environment and operating requirements, may be used without departing from the principles and scope of this disclosure. These and other changes or modifications are intended to be included within the scope of the present disclosure.

Those having skill in the art will find apparent that changes may be made to the details of the above-described embodiments without departing from the underlying principles of the invention. Embodiments of the invention in which an exclusive property or privilege is claimed are defined as follows. The scope of the present invention should, therefore, be determined only by the following claims.

What is claimed is:
1. An electricity monitoring device, comprising:
   a measuring conductor to electrically couple to a monitored energy source to read voltage of the monitored energy source;
   an electrical component in which a fluctuating magnetic field is induced from a fluctuating flow of electrical current in the monitored energy source, the fluctuating magnetic field to produce an electromotive force to provide electrical energy;
   a controller configured to determine a present electrical voltage of the monitored energy source based on the reading of the measuring conductor; and
   a coupling cable having a wire shield, the coupling cable configured to provide electrical energy to the controller absent of reading distortion.
2. The electricity monitoring device of claim 1, wherein the electrical component detects the rate of current flowing through the monitored energy source while the fluctuating magnetic field is induced, and
   wherein the controller is further to determine a present run-time electrical current of the monitored energy source.
3. The electricity monitoring device of claim 1, wherein the coupling cable is to electrically couple the measuring conductor and the electrical component to the controller.
4. The electricity monitoring device of claim 3, wherein the coupling cable is configured to power the controller without causing reading distortion simultaneous with the controller determining the present run-time electrical voltage and the present run-time electrical current via the coupling cable.
5. The electricity monitoring device of claim 3, wherein coupling cable is coupled to the measuring conductor and the electrical component at a first end and coupled to the controller at a second end, wherein the controller determines the voltage and current as passed through the coupling cable.
6. The electricity monitoring device of claim 1, wherein the electrical component comprises a Rogowski coil.
7. The electricity monitoring device of claim 6, wherein the measuring conductor is disposed in at least one of connecting end portions of the Rogowski coil and extends radially inward from to the monitored energy source.
8. The electricity monitoring device of claim 1, further comprising a securement mechanism to physically couple the electricity monitoring device and the monitored energy source with the measuring conductor radially toward a center of the monitored energy source cross-section.

9. The electricity monitoring device of claim 1, wherein the measuring conductor is configured to pierce an insulation material surrounding the monitored energy source.

10. The electricity monitoring device of claim 9, wherein an aperture that is formed in the insulation material in response to the piercing of the insulation material by the measuring conductor is such that the monitored energy source is inaccessible to be electrically coupled with a user.

11. The electricity monitoring device of claim 9, wherein the measuring conductor is formed such that, in response to the measuring conductor being removed, the insulation material surrounding the monitored energy source is configured to elastically recover such that an aperture in the insulation material from piercing by the measuring conductor is substantially closed in response to the measuring conductor being removed.

12. The electricity monitoring device of claim 1, further comprising a housing from which the measuring conductor extends.

13. The electricity monitoring device of claim 12, wherein the housing is formed such that a shape of the housing guides the measuring conductor radially toward a cross-section center of the monitored energy source.

14. The electricity monitoring device of claim 1, further comprising:
a protector to guard the conductor, wherein the measuring conductor in an inoperative position is configured to be disposed at least partially inside the protector.

15. The electricity monitoring device of claim 14, wherein the protector is sufficiently flexible to be deformed for piercing it by the measuring conductor.

16. The electricity monitoring device of claim 14, wherein the protector is sufficiently flexible to substantially return to its original shape in response to the measuring conductor being released from its coupling with the monitored energy source.

17. The electricity monitoring device of claim 1, wherein the electrical component provides a first portion and a second portion of the electrical energy obtained from the monitored energy source.

18. The electricity monitoring device of claim 17, wherein the first portion of the electrical energy is (i) sufficient to power the controller and (ii) insufficient to interfere with voltage measurement of the second portion of the electrical energy obtained from the monitored energy source.

19. A method for monitoring electricity in an energy source, the method comprising:
electrically coupling, through a measuring conductor, a monitored energy source to a controller comprising a processing circuitry;
producing electrical energy within an electrical component by induction, including driving an electromotive force in the electrical component from a fluctuating magnetic field generated from a fluctuating flow of electrical current in the monitored energy source to provide power to the processing circuitry;
performing one or more operations by the processing circuitry, including measuring present run-time electrical voltage in the monitored energy source in response to the monitored energy source providing the electrical energy to power the processing circuitry.

20. The method of claim 19, wherein the measuring conductor is configured to pierce an insulation material surrounding the monitored energy source.

21. The method of claim 20, wherein an aperture that is formed in the insulation material in response to the piercing of the insulation material by the measuring conductor is such that the monitored energy source is inaccessible to be electrically coupled with a user.

22. The method of claim 20, wherein the measuring conductor is formed such that, in response to the measuring conductor being removed, the insulation material surrounding the monitored energy source is configured to elastically recover such that an aperture in the insulation material from piercing by the measuring conductor is substantially closed in response to the measuring conductor being removed.

* * * * *